United States Patent [19]

Toyooka et al.

[11] Patent Number: 4,550,388

[45] Date of Patent: Oct. 29, 1985

[54] METHOD OF CONTROLLING STOP OPERATION OF ROTATING MAGNETIC FIELD FOR MAGNETIC BUBBLE MEMORY DEVICE

[75] Inventors: Takashi Toyooka, Sayama; Kazutoshi Yoshida, Mobara; Kazuhiro Ishida, Mobara; Tatsuo Okahashi, Mobara; Hirokazu Aoki, Hachioji; Ryo Suzuki, Kodaira; Yutaka Sugita, Tokorozawa, all of Japan

[73] Assignees: Hitachi, Ltd.; Hitachi Microcomputer Engineering Ltd., both of Tokyo, Japan

[21] Appl. No.: 636,671

[22] Filed: Aug. 1, 1984

[30] Foreign Application Priority Data

Aug. 3, 1983 [JP] Japan ............................. 58-141230

[51] Int. Cl.$^4$ ............................................. G11C 19/08
[52] U.S. Cl. ....................................................... 365/6
[58] Field of Search .......................................... 365/6

[56] References Cited

FOREIGN PATENT DOCUMENTS

| 0024650 | 3/1974 | Japan | 365/6 |
|---|---|---|---|
| 0088438 | 8/1974 | Japan | 365/6 |
| 0092647 | 7/1975 | Japan | 365/6 |
| 0030442 | 3/1976 | Japan | 365/6 |
| 0013842 | 2/1978 | Japan | 365/6 |
| 0125935 | 9/1979 | Japan | 365/6 |
| 0122288 | 9/1980 | Japan | 365/6 |
| 0058281 | 4/1982 | Japan | 365/6 |
| 0131685 | 4/1982 | Japan | 365/6 |
| 0012190 | 1/1983 | Japan | 365/6 |

Primary Examiner—James W. Moffitt
Attorney, Agent, or Firm—Antonelli, Terry & Wands

[57] ABSTRACT

In a magnetic bubble memory device in which magnetic bubbles are propagated under influence of a rotating magnetic field, a method of controlling a stop operation of a rotating magnetic field in which magnetic field is caused to further rotate beyond the stop direction for a predetermined over-rotation angle and is then caused to return to the stop direction which is followed by the removal of the magnetic field, is presented. The over-rotation angle is in a range of 10 to 40 degrees. The invention is applicable whether bubble drive is performed using a drive current of triangular, square or trapezoidal waveform.

8 Claims, 32 Drawing Figures

METHOD OF CONTROLLING STOP OPERATION OF ROTATING MAGNETIC FIELD FOR MAGNETIC BUBBLE MEMORY DEVICE

The present invention relates generally to a magnetic bubble memory device and more particularly to an improved method of controlling a stop operation of a rotating magnetic field for the magnetic bubble memory device in which probability of erroneous operation of the bubble memory device at the time of drive field start/stop operation is reduced.

In the magnetic bubble memory device, driving of the magnetic bubbles is effected by a rotating magnetic field which rotates in a plane (xy-plane) of the bubble memory device.

More specifically, a permalloy pattern and/or an ion-implanted pattern is provided on the surface of the bubble memory element, which pattern is exposed to the rotating magnetic field to move attractive poles for thereby causing the magnetic bubbles to be propagated.

For driving the bubbles, there have heretofore been employed a rotating magnetic field rotating along a circular path or locus as shown in FIG. 1A, a magnetic field rotating along an octagonal path shown in FIG. 1B, and a magnetic field rotating along a square path shown in FIG. 1C.

The rotating magnetic fields of three types mentioned above can be generated by applying x-coil currents $I_x$ and y-coil currents $I_y$ of waveforms illustrated in FIGS. 3A, 3B and 3C, respectively, to an x-coil 1 and a y-coil 2 disposed orthogonally to each other, as is shown in FIG. 2.

For realizing the features characteristic of the magnetic bubble memory device, i.e. nonvolatility and low power consumption, arrangement is made such that the rotating magnetic field is applied only at the time of operation, while the magnetic field is removed in the standby state of the bubble device.

Upon starting and stopping of the rotating magnetic field mentioned above, it is necessary to start rotation of the rotating magnetic field after the field has been oriented in a predetermined or specific direction (($+$)y-direction in the case of the illustrated embodiment), while the removal of the magnetic field has to be effected only after the magnetic field has been oriented in the specific direction, as is illustrated in FIGS. 4A, 4B and 4C.

The driving concept mentioned above is disclosed in detail, for example, in Japanese patent applications Laid-Open Nos. 88438/74 and 30442/76.

Further, it is known that stability in operation of the bubble memory device can be enhanced by applying a DC magnetic field on the order of 2 to 10 Oe in the direction in which the field rotation is stopped even after the rotating field has been stopped (refer to Japanese patent application Laid-Open No. 24650/74).

In reality, however, when a number of the bubble memory elements are manufactured and subjected to operation in accordance with the method mentioned above, it is seen that erroneous operation takes place although the probability thereof is relatively low.

As the means for preventing the erroneous operation, there have been proposed four types of methods described below.

According to a first method, the rotating magnetic field in the ($+$)y-direction is intensified upon stoppage of the magnetic field rotation.

According to a second known method, the field of the ($+$)y-direction is held for a predetermined time upon stoppage of the rotating field. The first and second methods are disclosed in Japanese patent applications Laid-Open Nos. 13842/78 and 125935/79.

According to a third method, the magnetic field is, upon initiation of rotation, once oriented in the ($+$)y-direction, which is followed by rotation of the field for about 45° in the reverse direction to the normal rotational direction, and thereafter the rotation of the magnetic field is initiated in the normal or forward direction.

Further, according to a fourth method, when stopping the magnetic field, the magnetic field is rotated once beyond the ($+$)y-axis and then the magnetic field is rotated back to the ($+$)y-axis, whereupon rotation of the magnetic field is stopped. The third and fourth methods are taught in Japanese patent application Laid-Open No. 58281/82.

The locus of the magnetic field upon starting and stopping rotation thereof as well as waveforms of the x-coil current $I_x$ and the y-coil current $I_y$ are illustrated in FIGS. 5A, 5B, 6A, 6B, 7A, 7B, 8A and 8B.

FIGS. 5A and 5B correspond to the first method mentioned above, and FIGS. 6A and 6B, 7A and 7B, and 8A and 8B correspond, respectively, to the second, third and the fourth methods mentioned above.

Although the triangular waveforms of the driving current are illustrated in FIGS. 5A to 8B, it will be appreciated that the loci (circular and octagonal loci) of the rotating magnetic field can be generated in correspondence to sinusoidal and trapezoidal waveforms of the driving current, respectively.

It has been established that the four types of methods mentioned above are effective to some extent for reducing erroneous operation of the magnetic bubble memory device which will occur upon starting and stopping of the rotation of the magnetic field.

FIG. 9 is a view for illustrating characteristically an error free time $T_F$ (i.e. averaged time interval at which error is produced in a single bubble memory element or a single chip) as a function of intensity of the inplane D.C. field $H_{DCY}$ when the bubble element is driven in accordance with the driving methods of the four varieties mentioned above and according to the ordinary method illustrated in FIG. 4C (i.e., rotation of the magnetic field is instantly stopped when it comes in a predetermined direction in which it is to be stopped).

In FIG. 9, curves (a) to (d) correspond, respectively, the first to fourth methods illustrated in FIGS. 5A and 5B, 6A and 6B, 7A and 7B, and 8A and 8B, while a curve (e) corresponds to the ordinary driving method (illustrated in FIG. 4C).

As will be seen in FIG. 9, the error free time $T_F$ is increased as the value of the inplane D.C. field $H_{DCY}$ is increased. Accordingly, by setting the inplane D.C. field $H_{DCY}$ at a sufficiently large value, the error free time $T_F$ can assume a practically sufficiently large value.

In this connection, it is however noted that the value of the inplane D.C. field $H_{DCY}$ can not be set at an adequately large value due to restriction imposed by structural factors of the memory module. More specifically, intensity of the inplane D.C. field is limited within a range of 5 to 6 Oe. Further, in consideration of variation or ununiformity in the structure as well as characteristics of the memory modules, it is desirable from the practical viewpoint that a sufficiently long error free time can be realized at the intensity of the inplane D.C. field on the order of 4 Oe.

In view of the foregoing, it is an object of the present invention to provide a method of controlling a stop operation of a rotating magnetic field for a magnetic bubble memory device which enjoys a significantly extended error free time $T_F$ at the inplane D.C. magnetic field $H_{DCY}$ of a practically realizable range.

For accomplishing the object mentioned above, it is proposed according to an aspect of the present invention that the relationship between the error free time $T_F$ and an angle by which angle the rotating magnetic field is made to rotate beyond or overrun the direction in which it is to be finally stopped for a given value (e.g. 4 Oe) of the inplane D.C. magnetic field $H_{DCY}$ is examined in the fourth driving method illustrated in FIGS. 8A and 8B, and 6(d), to thereby determine the conditions which allow the error free time $T_F$ to be increased.

More specifically, it is contemplated with the present invention that rotation of the magnetic field is finally stopped or removed after allowing the magnetic field to rotate beyond a predetermined direction in which it is to be finally stopped by an angle in a range of 10° to 40° and then rotating back the rotating magnetic field until it comes in the predetermined direction, to thereby realize an increased error free time with the inplane D.C. magnetic field $H_{DCY}$ of a practically realizable range.

The present invention will be apparent from the following detailed description taken in conjunction with the accompanying drawings, in which.

In the following, the invention will be described in detail in conjunction with the preferred embodiments thereof.

Figure 10:
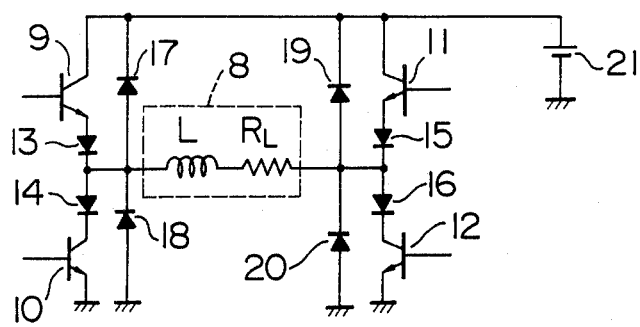
FIG. 10 is a view showing a rotating magnetic field drive circuit used in the invention.

FIG. 10 is a circuit diagram showing a rotating magnetic field driving circuit used in carrying out the invention.

In FIG. 10, reference numeral 8 denotes a coil, 9 to 12 denote transistors, 13 to 20 denote diodes, and 21 denotes a power supply source.

Figure 11:
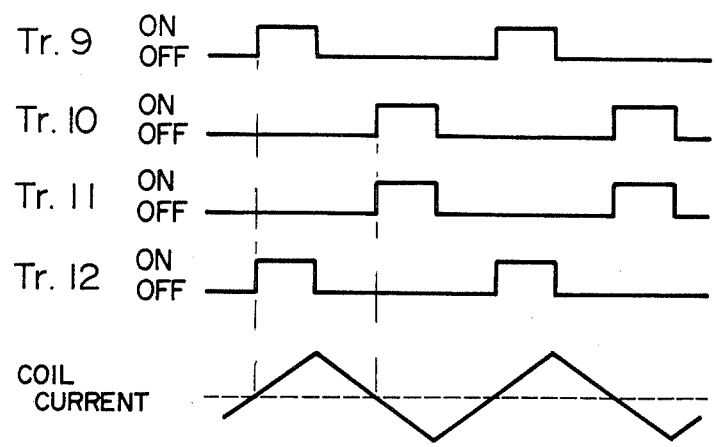
FIG. 11 is a view for illustrating a waveform of the driving current which can be generated by the rotating magnetic field drive circuit shown in FIG. 10 together with transistor ON/OFF signals.

Through ON/OFF control of the transistors 9 to 12 of the circuit shown in FIG. 10 in a manner illustrated in FIG. 11, a coil current of a triangular waveform illustrated in FIG. 11 can flow through the coil 8.

In this connection, the circuit shown in FIG. 10 is disclosed in detail in Japanese patent application Laid-Open No. 92647/75.

Figure 1A:
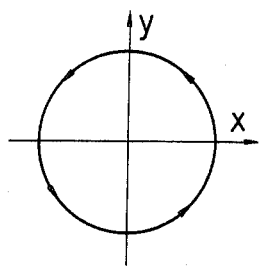
FIGS. 1A to 1C are views for illustrating, respectively, a circular path, an octagonal path and a square path of a rotating magnetic field, by way of example.
Figure 1B:
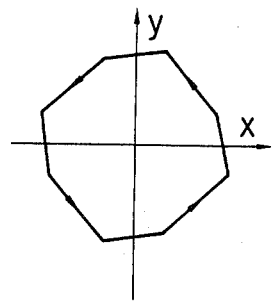
Figure 1C:
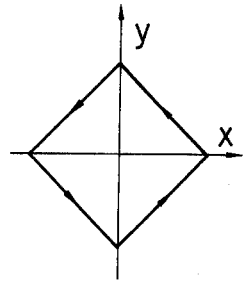
Figure 2:
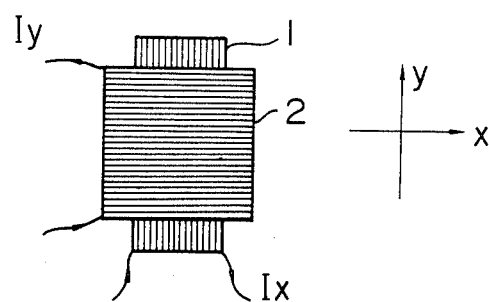
FIG. 2 is a view showing an exemplary driving coil arrangement including an x-coil and a y-coil.
Figure 3A:
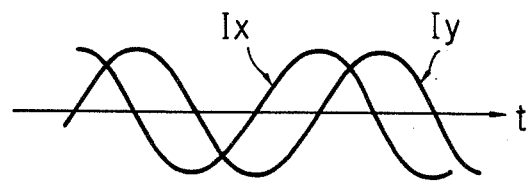
FIGS. 3A to 3C are views for illustrating waveforms of drive currents ($I_x$, $I_y$) supplied to the x-coil and the y-coil, respectively.
Figure 3B:
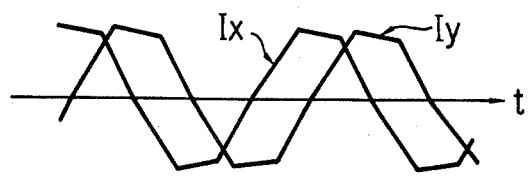
Figure 3C:
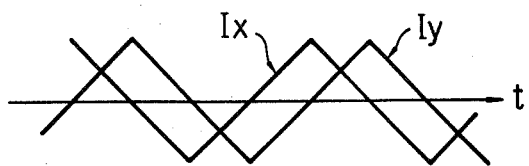

A pair of the circuits each shown in FIG. 10 are employed, wherein the x-coil shown in FIG. 2 is connected as the coil 8 in one of the circuits while the y-coil shown in FIG. 2 is connected as the coil 8 in the other circuit. In this connection, the transistors constituting parts of the x-coil drive circuit are denoted by 9 to 12 with those of the y-coil drive circuit being denoted by 9' to 12', respectively.

Through ON/OFF control of the transistors 9 to 12 and 9' to 12' in both the drive circuits mentioned above in a manner illustrated in FIG. 12, there can be obtained an x-coil current and a y-coil current represented by $I_x$ and $I_y$, respectively, in FIG. 12.

Figure 4A:
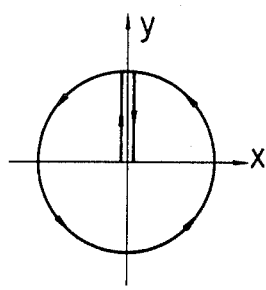
FIGS. 4A to 4C are views for illustrating the paths of the rotating magnetic fields, respectively, at the time of stoppage of rotation of the magnetic fields in hitherto known magnetic bubble memory devices.
Figure 4B:
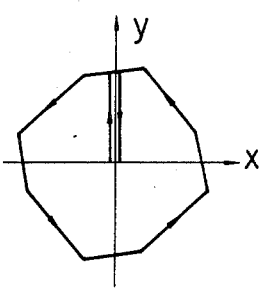
Figure 4C:
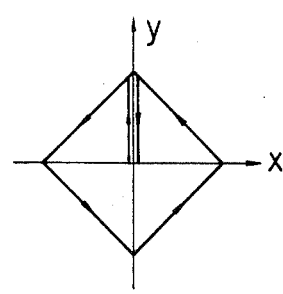
Figure 5A:
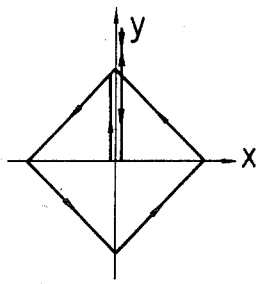
FIGS. 5A, 5B, 6A, 6B, 7A, 7B, 8A and 8B are views for illustrating paths followed by the rotating magnetic fields upon stoppage thereof according to hitherto known methods of preventing the erroneous operation of the bubble memory device.
Figure 5B:
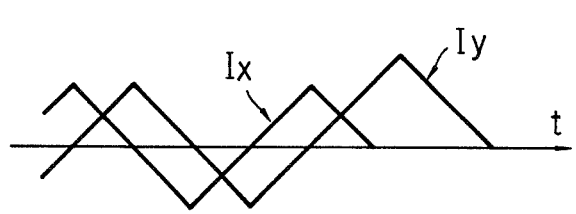
Figure 6A:
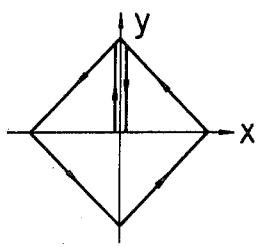
Figure 6B:
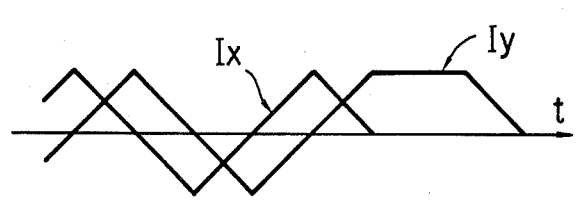
Figure 7A:
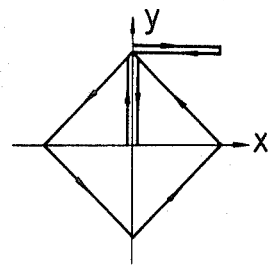
Figure 7B:
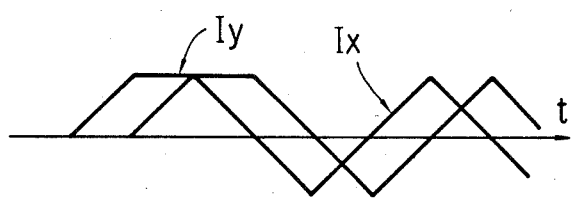
Figure 8A:
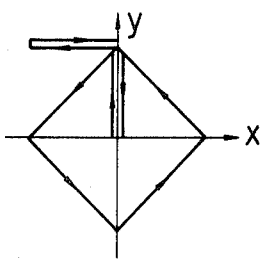
Figure 8B:
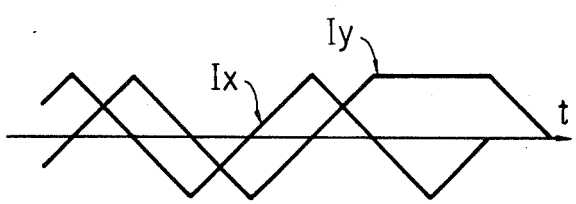
Figure 12:
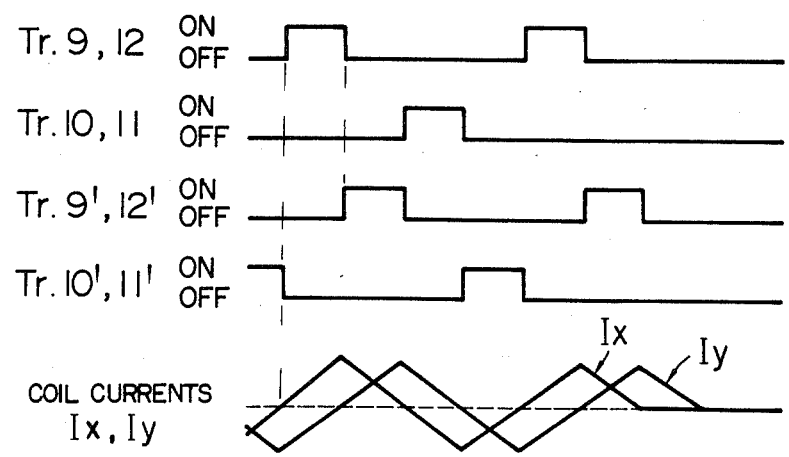
FIG. 12 is a view for illustrating the waveform of the driving currents produced by a pair of the rotating magnetic field driving circuits shown in FIG. 10 incorporating the x-coil and the y-coil, respectively, when driven in accordance with the prior art method.

The control illustrated in FIG. 12 corresponds to the ordinary field stopping method described hereinbefore by referring to FIG. 4C. More specifically, when the x-coil current $I_x$ returns to zero from a positive peak, operation of the x-coil drive circuit is stopped. On the other hand, when the y-coil current returns to zero from a positive peak, operation of the y-coil drive circuit is stopped.

Next, a first exemplary embodiment of the invention will be described.

Figure 13:
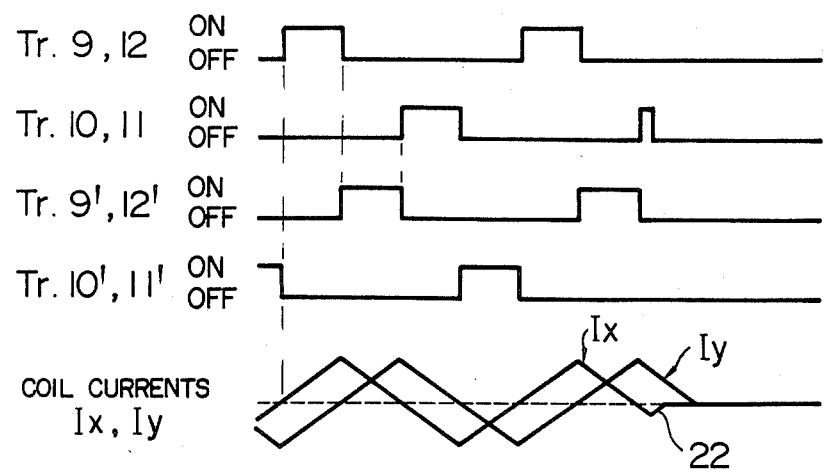
FIG. 13 is a view for illustrating a driving current waveform generated according to an embodiment of the invention.
Figure 14:
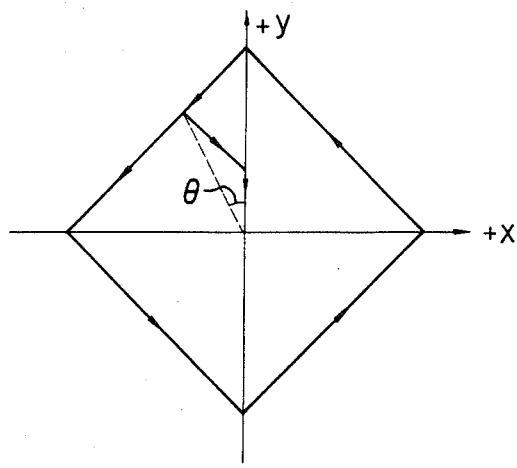
FIG. 14 is a view for illustrating a path followed by a rotating magnetic field produced through the driving current illustrated in FIG. 10.

FIG. 13 is a diagram illustrating a waveform of the coil driving currents produced according to an embodiment of the invention, and FIG. 14 shows a locus of a rotating magnetic field generated through the current of the waveform illustrated in FIG. 13.

As shown in FIG. 13, when the x-coil current $I_x$ returns to zero from a positive peak, the transistors 10 and 11 are turned on for a period which is longer than 0% of the period of the rotating magnetic field and shorter than 12.5% thereof, to thereby cause a current 22 of a triangular waveform having a narrow width and a small amplitude to flow through the x-coil in the negative direction after the x-coil current $I_x$ returns to zero from the positive peak. On the other hand, the y-coil drive current $I_y$ is of the same waveform as illustrated in FIG. 12.

By controlling the drive current in the manner mentioned above, a rotating magnetic field which follows a square path shown in FIG. 14 is generated. More specifically, the rotating magnetic field once rotates beyond the (+)y-axis (corresponding to the direction in which the rotation is to be stopped) and subsequently turns at a right angle toward the (+)y-axis to reach the origin (the state of zero field).

Figure 15:
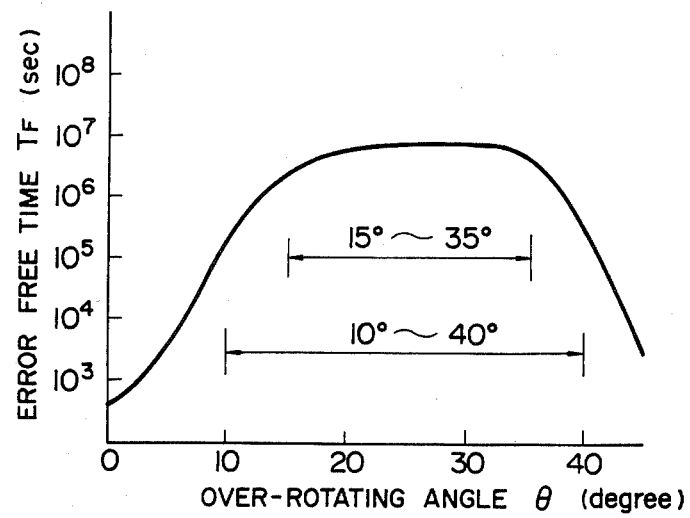
FIG. 15 is a view for illustrating a relationship between the error free time ($T_F$) and an angle ($\theta$) representative of over-rotation of the magnetic field in a magnetic bubble memory device driven by the current of the waveform illustrated in FIG. 13.

A relationship between the angle $\theta$ (degree) by which the magnetic field rotates beyond the (+)y-axis and an error free time $T_F$ (second) is illustrated in FIG. 15 on the assumption that the inplane D.C. field $H_{DCY}$ is 4 Oe.

Figure 9:
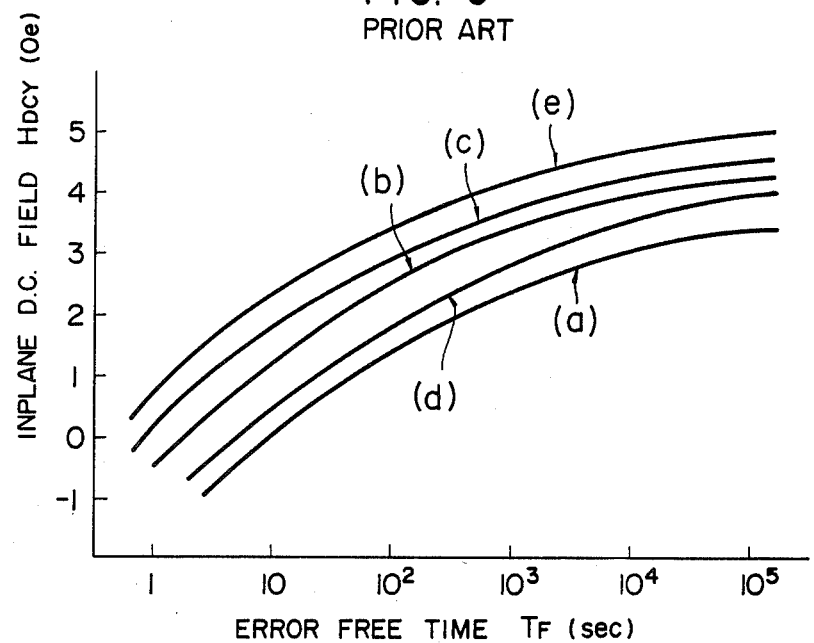
FIG. 9 is a view for illustrating graphically a relationship between the inplane D.C. magnetic field ($H_{DCY}$) and the error free time ($T_F$)

As will be seen in FIG. 15, when the over-rotation angle $\theta$ is in a range of about 10 to 40 degrees, the error free time $T_F$ is more than $10^5$ seconds which is longer by a factor of 10 or more when compared with the error free time given by the relation represented by the curve (e) in FIG. 9.

Particularly when the over-rotation angle $\theta$ is in a range of about 15 to about 35 degrees, the error free time $T_F$ becomes close to a value of $10^7$ seconds, assuring excellently improved characteristic.

In this way, by setting the over-rotation angle $\theta$ in a range of 10 to 40 degrees when the rotating magnetic field which follows the path shown in FIG. 14 is employed, there can be obtained preferable characteristic. More preferably, the over-rotation angle $\theta$ should be in a range of 15 to 35 degrees.

Figure 16:
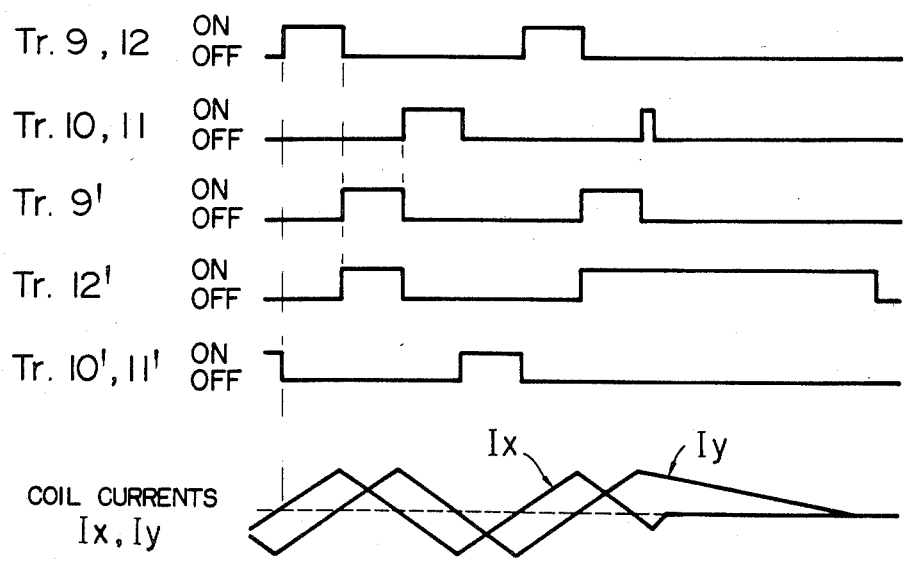
FIG. 16 is a view for illustrating waveform of a driving current generated according to another embodiment of the present invention.
Figure 17:
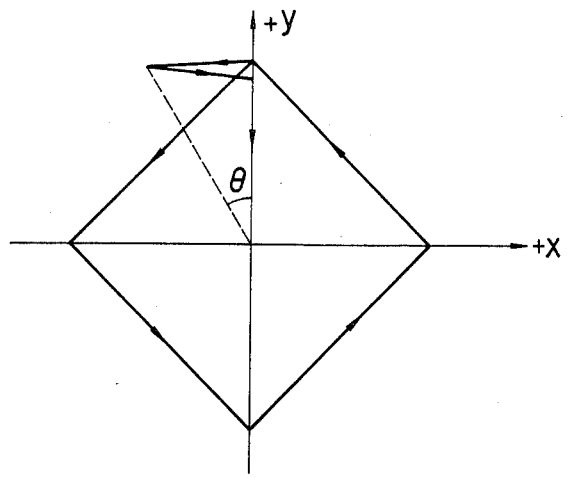
FIG. 17 is a view for illustrating the path followed by a rotating magnetic field produced through the driving current illustrated in FIG. 13.

FIG. 16 illustrates a waveform of the coil drive currents according to another embodiment of the invention, and FIG. 17 is a diagram showing a path followed by the rotating magnetic field as generated.

Referring to FIG. 16, the transistors 10 and 11 are turned on for a period longer than 0% of the period of the rotating magnetic field and not longer than 25% thereof, when the x-coil current $I_x$ returns to zero after having attained a positive peak, whereby a negative current of a triangular waveform is caused to flow through the x-coil. Additionally, the transistor 12' is turned on in a manner illustrated in FIG. 16 at Tr.12', to thereby stretch correspondingly the y-coil current $I_y$.

The rotating magnetic field generated in this way follows a path shown in FIG. 17. More specifically, the path extends once beyond the (+)y-axis substantially in parallel with the (−)x-axis and then returns toward the (+)y-axis to reach ultimately the origin.

Figure 18:
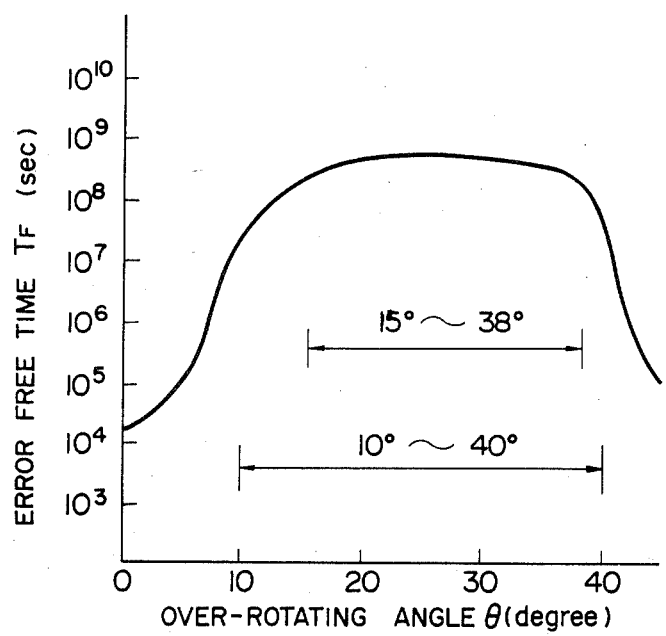
FIG. 18 is a view for illustrating a relationship between the over-rotation angle ($\theta$) and the error free time ($T_F$) in the embodiment illustrated in FIG. 13.

FIG. 18 graphically shows a relationship between the over-rotation angle $\theta$ shown in FIG. 17 and the error free time $T_F$ on the assumption that inplane D.C. field $H_{DCY}$ is 4 Oe.

It will be seen in FIG. 18 that when the over-rotation angle $\theta$ is in a range of about 10 to about 40 degrees, the error free time $T_F$ is more than $10^7$ seconds, longer by a factor of more than 1,000 than the error free time given by the curve (e) shown in FIG. 9.

In particular, when the over-rotation angle is in a range of about 15 to about 38 degrees, the error free time $T_F$ assumes a value in a range of $10^8$ to $10^9$ seconds, assuring a remarkable improvement over the prior art.

In the case of the second embodiment described just above, the error free time $T_F$ is about 20 to 30 times as high as that of the first embodiment, meaning significant improvement over the latter.

In the foregoing, description has been made in conjunction with the driving system employing the coil currents of triangular waveform (i.e. the rotating magnetic field following the square path). It is, however, self-explanatory that the invention can equally be applied to the driving system in which the coil drive current of sinusoidal waveform (rotating magnetic field of a circular path) or of a trapezoidal waveform (rotating field of an octagonal path) is employed.

Figure 19A:
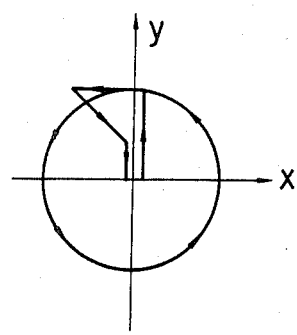
FIGS. 19A and 19B are views for illustrating a path of a rotating magnetic field produced according to further embodiments of the invention applied to a sinusoidal current drive system.
Figure 19B:
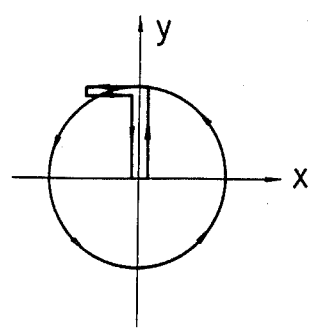

FIGS. 19A and 19B illustrate driving methods in which the drive current of a sinusoidal waveform is employed. Referring to FIG. 19A, the rotating magnetic field overruns once the (+)y-axis (stop direction) and turns at a right angle relative to the circular path toward the (+)y-axis to ultimately reach the origin. In the case shown in FIG. 19B, the rotating field once overruns the (+)y-axis and turns toward the latter substantially along the circular path to ultimately reach the origin. In both cases, the over-rotation angle $\theta$ is in a range of 10 to 40 degrees.

Figure 20A:
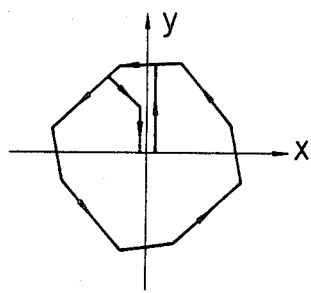
FIGS. 20A and 20B are views for illustrating a path of a rotating magnetic field produced by a trapezoidal current drive system according to still further embodiments of the invention.
Figure 20B:
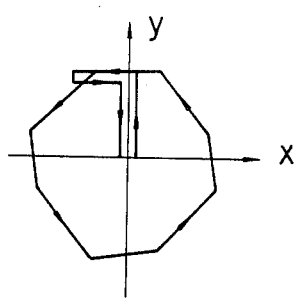

FIGS. 20A and 20B show driving methods in which the drive current of a trapezoidal waveform is employed. Referring to FIG. 20A, the magnetic field rotating along an octagonal path overruns once the (+)y-axis and turns at a right angle toward the (+)y-axis to finally reach the origin. In the case of the driving method shown in FIG. 20B, too, the magnetic field rotating along an octagonal path overruns once the (+)y-axis and returns toward the (+)y-axis following substantially along the path along which the magnetic field has just overrun the (+)y-axis, to finally reach the origin. In both cases, the over-rotation angle $\theta$ is in a range of 10 to 40 degrees.

As will be appreciated from the foregoing description, it is possible according to the invention to increase significantly the error free time $T_F$ with the inplane D.C. magnetic field $H_{DCY}$ being maintained at a practical value (e.g. 4 Oe). The probability of erroneous operation of the magnetic bubble memory is thus remarkably reduced with the stability thereof being enhanced, to great advantages.

We claim:

1. A method of controlling a stop operation of a rotating magnetic field for a magnetic bubble memory device in which magnetic bubbles are propagated by said rotating magnetic field, comprising the steps of:
    rotating said magnetic field beyond a predetermined direction by an angle in a range of 10 to 40 degrees;
    rotating back said magnetic field until said magnetic field comes in said predetermined direction; and
    removing said magnetic field when said magnetic field comes in said predetermined direction.

2. A method of controlling a stop operation of a rotating magnetic field for a magnetic bubble memory device according to claim 1, wherein said rotating magnetic field is further rotated beyond said predetermined direction along the path of said rotating magnetic field.

3. A method of controlling a stop operation of a rotating magnetic field for a magnetic bubble memory device according to claim 2, wherein the path of said rotating magnetic field is of an octagonal form.

4. A method of controlling a stop operation of a rotating magnetic field for a magnetic bubble memory device according to claim 2, wherein the path of said rotating magnetic field is of a square form.

5. A method of controlling a stop operation of a rotating magnetic field for a magnetic bubble memory device according to claim 1, wherein said rotating magnetic field overruns said predetermined direction in a direction perpendicular to said direction.

6. A method of controlling a stop operation of a rotating magnetic field for a magnetic bubble memory device according to claim 5, wherein the path followed by said rotating magnetic field is of a circular form.

7. A method of controlling a stop operation of a rotating magnetic field for a magnetic bubble memory device according to claim 5, wherein the path followed by said rotating magnetic field is of an octagonal form.

8. A method of controlling a stop operation of a rotating magnetic field for a magnetic bubble memory device according to claim 5, wherein the path followed by said rotating magnetic field is of a square form.

* * * * *